(12) United States Patent
Lu et al.

(10) Patent No.: US 11,495,548 B2
(45) Date of Patent: Nov. 8, 2022

(54) SEMICONDUCTOR PACKAGE HAVING THIN SUBSTRATE AND METHOD OF MAKING THE SAME

(71) Applicant: ALPHA AND OMEGA SEMICONDUCTOR INTERNATIONAL LP, Sunnyvale, CA (US)

(72) Inventors: Jun Lu, San Jose, CA (US); Long-Ching Wang, Cupertino, CA (US); Madhur Bobde, Sunnyvale, CA (US); Bo Chen, Shanghai (CN); Shuhua Zhou, Shanghai (CN)

(73) Assignee: ALPHA AND OMEGA SEMICONDUCTOR INTERNATIONAL LP, Sunnyvale, CA (US)

( * ) Notice: Subject to any disclaimer, the term of this patent is extended or adjusted under 35 U.S.C. 154(b) by 17 days.

(21) Appl. No.: 17/137,893

(22) Filed: Dec. 30, 2020

(65) Prior Publication Data

US 2021/0125940 A1 Apr. 29, 2021

Related U.S. Application Data

(63) Continuation-in-part of application No. 15/849,295, filed on Dec. 20, 2017, now Pat. No. 10,991,660.

(51) Int. Cl.
*H01L 23/31* (2006.01)
*H01L 23/00* (2006.01)
(Continued)

(52) U.S. Cl.
CPC ........ *H01L 23/562* (2013.01); *H01L 21/6835* (2013.01); *H01L 21/78* (2013.01);
(Continued)

(58) Field of Classification Search
CPC ... H01L 23/562; H01L 21/6835; H01L 21/78; H01L 23/15; H01L 23/3114; H01L 2221/68327; H01L 23/3171; H01L 2224/04026; H01L 2224/05124; H01L 2224/05555; H01L 2224/0557; H01L 2224/05624; H01L 2224/05647; H01L 2224/06051; H01L 2224/2919; H01L 2924/13091; H01L 24/06; H01L 24/05;
(Continued)

(56) References Cited

U.S. PATENT DOCUMENTS

| 9,570,295 | B1 * | 2/2017 | Bedell | ............... H01L 33/44 |
| 9,748,353 | B2 * | 8/2017 | Bedell | ............... H01L 33/32 |
| 9,831,115 | B2 * | 11/2017 | Peidous | ......... H01L 21/76251 |

* cited by examiner

*Primary Examiner* — Vu A Vu
(74) *Attorney, Agent, or Firm* — Chen-Chi Lin

(57) ABSTRACT

A semiconductor package comprises a semiconductor substrate, a first metal layer, an adhesive layer, a second metal layer, a rigid supporting layer, and a plurality of contact pads. A thickness of the semiconductor substrate is equal to or less than 50 microns. A thickness of the rigid supporting layer is larger than the thickness of the semiconductor substrate. A thickness of the second metal layer is larger than a thickness of the first metal layer. A method comprises the steps of providing a device wafer; providing a supporting wafer; attaching the supporting wafer to the device wafer via an adhesive layer; and applying a singulation process so as to form a plurality of semiconductor packages.

18 Claims, 4 Drawing Sheets

(51) Int. Cl.
*H01L 21/78* (2006.01)
*H01L 21/683* (2006.01)
*H01L 23/15* (2006.01)

(52) U.S. Cl.
CPC .......... *H01L 23/15* (2013.01); *H01L 23/3114* (2013.01); *H01L 2221/68327* (2013.01)

(58) Field of Classification Search
CPC ................. H01L 24/29; H01L 24/32; H01L 2224/05025; H01L 2224/05553; H01L 2224/05563; H01L 2224/05572; H01L 2224/05644; H01L 2224/05655; H01L 2224/06181; H01L 2224/32225; H01L 2924/3511
USPC ........................................................ 257/368
See application file for complete search history.

SEMICONDUCTOR PACKAGE HAVING THIN SUBSTRATE AND METHOD OF MAKING THE SAME

CROSS-REFERENCE RO RELATED APPLICATIONS

This Patent Application is a Continuation-in-part Application of a pending U.S. patent application Ser. No. 15/849,295 filed on Dec. 20, 2017 and published as US Patent Application Publication No. 2019/0189569 on Jun. 20, 2019. The Disclosure made in U.S. patent application Ser. No. 15/849,295 is hereby incorporated by reference.

FIELD OF THE INVENTION

This invention relates generally to a semiconductor package having a thin semiconductor substrate and a method of making a plurality of semiconductor packages. More particularly, the present invention relates to a semiconductor package, operative in a sufficient safety factor range, having a substrate with a thickness in a range from 25 microns to 75 microns.

BACKGROUND OF THE INVENTION

Semiconductor packages such as a common-drain metal-oxide-semiconductor field-effect transistor (MOSFET) chip scale package (CSP) for battery protection application and a semiconductor power package usually have a semiconductor substrate thickness of one hundred microns or more. The semiconductor substrate contributes a significant amount of DC resistance. It is advantageous to reduce the semiconductor substrate thickness to be less than 50 microns so as to reduce the DC resistance and to increase the electrical performance.

Semiconductor substrate contributes a significant amount of direct-current (DC) resistance. It is advantageous to reduce a thickness of the semiconductor substrate for improved electrical performance. For example, the on-resistance can be reduced by 24% when the thickness of the semiconductor substrate is reduced from 50 microns to 25 microns. The mechanical strength of the semiconductor package decreases when the semiconductor substrate thickness decreases. In examples of the present disclosure, a rigid supporting layer attached to a metal layer having Young's modulus of 150 gigapascals is added to increase the mechanical strength. An increase of thickness of the attached metal layer may further slightly reduce the on-resistance (less sensitive than the effects from changing thickness of the semiconductor substrate). For example, the on-resistance can be reduced by 5% when the thickness of the attached metal layer is increased from 15 microns to 50 microns.

SUMMARY OF THE INVENTION

A semiconductor package comprises a semiconductor substrate, a first metal layer, an adhesive layer, a second metal layer, a rigid supporting layer, and a plurality of contact pads. A thickness of the semiconductor substrate is equal to or less than 75 microns. A thickness of the rigid supporting layer is larger than the thickness of the semiconductor substrate. A thickness of the second metal layer is larger than a thickness of the first metal layer.

A method for fabricating a plurality of semiconductor packages is disclosed. The method comprising the steps of providing a device wafer; providing a supporting wafer; attaching the supporting wafer to the device wafer via an adhesive layer; and applying a singulation process.

DETAILED DESCRIPTION OF THE INVENTION

Figure 1:
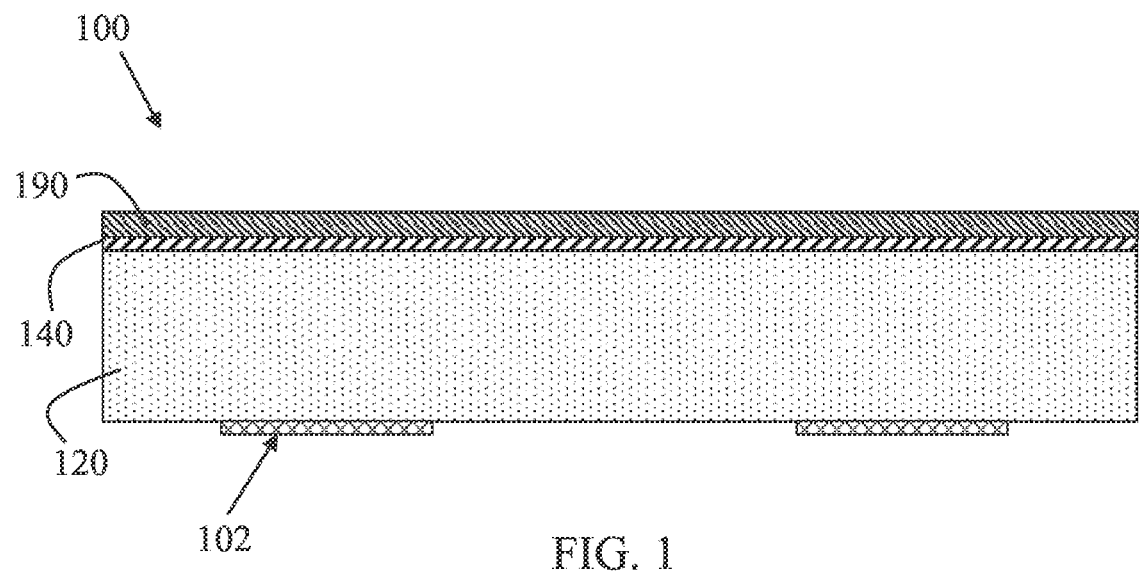
FIG. 1 shows a cross-sectional view of a conventional semiconductor package.

FIG. 1 shows a cross-sectional view of a conventional semiconductor package 100. The conventional semiconductor package 100 comprises a plurality of contact pads 102, a semiconductor substrate 120, a metal layer 140, and a coating layer 190. In one example, the substrate 120 is 100 microns thick. The coating layer 190 does not provide sufficient mechanical strength support to the package. Warpage will occur during a surface mount solder reflow process.

Figure 2:
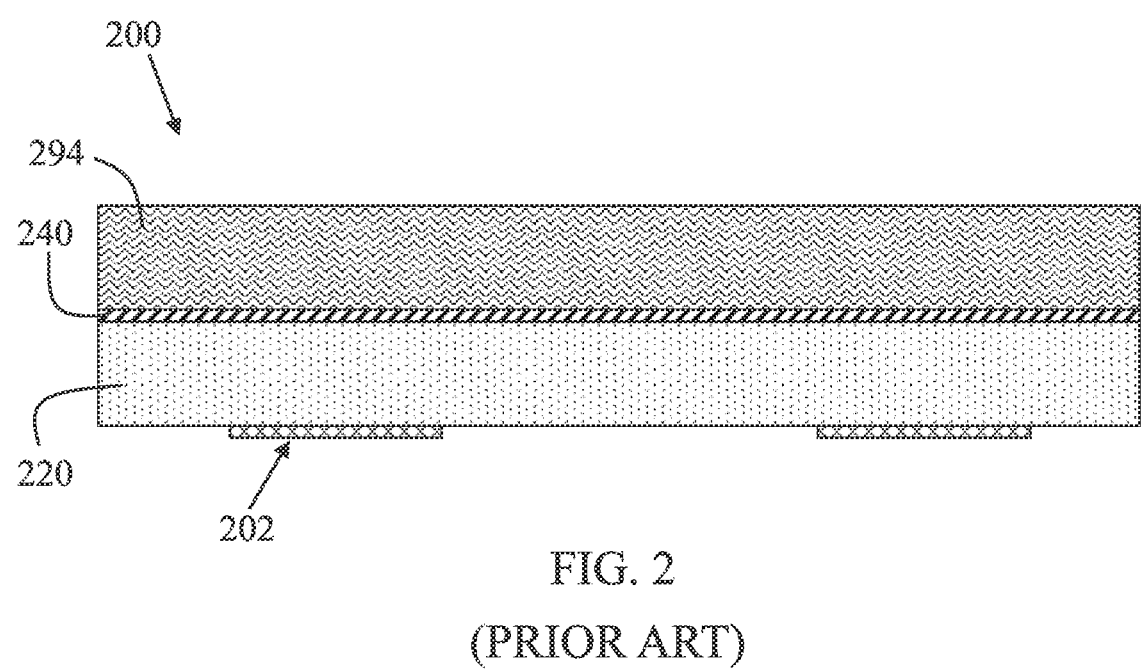
FIG. 2 shows a cross-sectional view of another conventional semiconductor package.

FIG. 2 shows a cross-sectional view of a conventional semiconductor package 200. The conventional semiconductor package 200 comprises a plurality of contact pads 202, a semiconductor substrate 220, a metal layer 240, and a protection tape 294. In one example, the semiconductor substrate 220 is 100 microns thick. The protection tape 294 does not provide sufficient mechanical strength support to the package. Warpage will occur during a surface mount solder reflow process.

FIGS. 3A and 3B of US Patent Application Publication No. 2019/0189569 show a semiconductor package comprising a semiconductor substrate, a metal layer, an adhesive layer, a rigid supporting layer, and a plurality of contact pads. Without an additional metal layer attached to the rigid supporting layer, a safety factor included in the mechanical performance requirement of the semiconductor package is not high when a thickness of the semiconductor substrate is reduced to 50-micron range.

Figure 3:
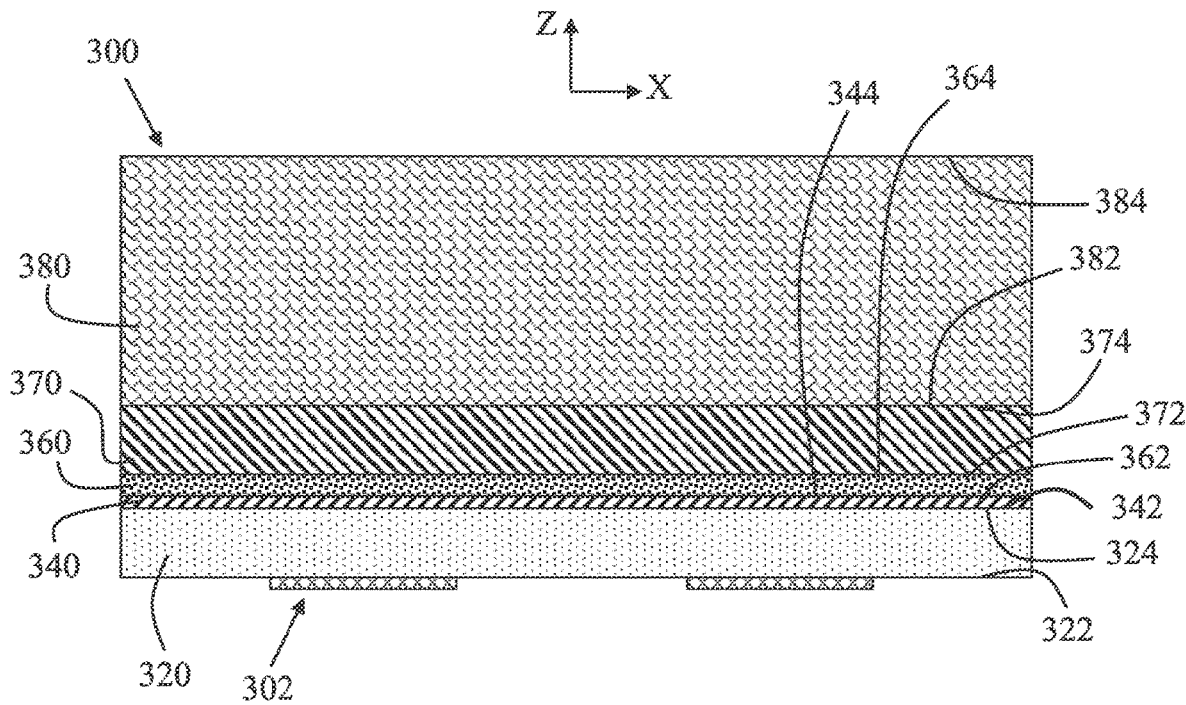
FIG. 3 shows a cross-sectional view of a semiconductor package having thin substrate in examples of the present disclosure.

FIG. 3 shows a cross-sectional view of a semiconductor package 300 in examples of the present disclosure. The semiconductor package 300 comprises a semiconductor substrate 320, a first metal layer 340, an adhesive layer 360, a second metal layer 370, a rigid supporting layer 380, and a plurality of contact pads 302.

The semiconductor substrate 320 has a front surface 322 and a back surface 324. The back surface 324 is opposite to the front surface 322. The first metal layer 340 has a front surface 342 and a back surface 344. The back surface 344 is opposite to the front surface 342. The adhesive layer 360 has a front surface 362 and a back surface 364. The back surface 364 is opposite to the front surface 362. The second metal layer 370 has a front surface 372 and a back surface 374. The back surface 374 is opposite to the front surface 372. The rigid supporting layer 380 has a front surface 382 and a back surface 384. The back surface 384 is opposite to the front surface 382.

In examples of the present disclosure, the front surface 342 of the first metal layer 340 is directly attached to the back surface 324 of the semiconductor substrate 320. The front surface 362 of the adhesive layer 360 is directly attached to the back surface 344 of the first metal layer 340. The front surface 372 of the second metal layer 370 is directly attached to the back surface 364 of the adhesive layer 360. The front surface 382 of the rigid supporting layer 380 is directly attached to the back surface 374 of the second metal layer 370. In one example, the plurality of contact pads 302 are attached to the front surface 322 of the semiconductor substrate 320. In another example, the plurality of contact pads 302 are directly attached to the front surface 322 of the semiconductor substrate 320.

In one example, a thickness of the semiconductor substrate 320 is equal to or less than 50 microns. In another example, the thickness of the semiconductor substrate 320 is in a range from 25 microns to 35 microns. In examples of the present disclosure, a thickness of the second metal layer 370 is in a range from 30 microns to 100 microns. The second metal layer 370 provides electrical path to reduce the on-resistance of the device. A thickness of the first metal layer 340 is in a range from 1 micron to 5 microns. A thickness of the first metal layer 340 is thinner than the thickness of the semiconductor substrate 320 so as to reduce overall warpage of the semiconductor package during manufacturing. A thickness of the second metal layer 370 is larger than a thickness of the first metal layer 340. In one example, edge surfaces of the semiconductor substrate 320, the second metal layer 370 and the rigid supporting layer 380 are respectively aligned and coplanar in all sides. In another example, edge surfaces of the semiconductor substrate 320, the first metal layer 340, the second metal layer 370 and the rigid supporting layer 380 are respectively aligned and coplanar in all sides. In yet another example, edge surfaces of the semiconductor substrate 320, the first metal layer 340, the adhesive layer 360, the second metal layer 370 and the rigid supporting layer 380 are respectively aligned and coplanar in all sides.

In examples of the present disclosure, a thickness of the rigid supporting layer 380 is in a range from 150 microns to 500 microns. The term "rigid" of the rigid supporting layer 380 refers to a material of the rigid supporting layer 380 stiffer than a tape material (for one example, a polyimide material or a polymer material). The thinner the semiconductor substrate 320 is, the better the electrical performance of each of the plurality of semiconductor packages is. It is advantageous to have a thickness of the semiconductor substrate 320 being less than 50 microns. The strength of the rigid supporting layer 380 is required to be even higher if a safety factor is included in the mechanical performance requirement of the semiconductor packages.

In examples of the present disclosure, a thickness is measured along a direction parallel to Z-axis of FIG. 3. In examples of the present disclosure, a thickness of the rigid supporting layer 380 is a shortest distance between the front surface 382 and the back surface 384. In examples of the present disclosure, the semiconductor substrate 320 comprises silicon material. In examples of the present disclosure, it is preferred to have the semiconductor package (having a 3.05 mm×1.77 mm planar dimension) to sustain more than 5 Newtons without breakage.

In examples of the present disclosure, the adhesive layer 360 comprises conductive adhesive. The rigid supporting layer 380 is non-conductive. Electrical current flows from a first contact pad of the plurality of contact pads 302, through the semiconductor substrate 320, the first metal layer 340, the adhesive layer 360, the second metal layer 370, the adhesive layer 360, the first metal layer 340, and the semiconductor substrate 320, to a second contact pad of the plurality of contact pads 302.

In examples of the present disclosure, the semiconductor package 300 is a common-drain metal-oxide-semiconductor field-effect transistor (MOSFET) chip scale package (CSP) for battery protection application. Two gates and two sources are on a front surface of the common-drain MOSFET CSP. A common-drain is on a back surface of the common-drain MOSFET CSP.

In examples of the present disclosure, an entirety of the rigid supporting layer 380 is made of a material having relatively high Young's modulus including a single crystal silicon material, a poly-crystal silicon material or a glass material. In examples of the present disclosure, an entirety of the rigid supporting layer 380 is made of a material having high Young's modulus including a silicon material, a glass material, or a silicon oxide glass material ($SiO_2$). The advantages are cost effectiveness and lighter semiconductor package weight. In examples of the present disclosure, a Young's modulus of an entirety of the rigid supporting layer 380 is in a range from 50% to 150% of a Young's modulus of the semiconductor substrate 320. A coefficient of thermal expansion (CTE) of the entirety of the rigid supporting layer 380 is in a range from 50% to 250% of the CTE of the semiconductor substrate 320.

In examples of the present disclosure, an entirety of the rigid supporting layer is made of a single crystal silicon material or a poly-crystal silicon material fabricated from a reclaimed silicon wafer. The advantage of using a reclaimed silicon wafer is for a cost reduction. A reclaimed silicon wafer is a used silicon wafer or a recycled silicon wafer. In one example, the used silicon wafer may be previously used for testing purpose. Etching processes and polishing processes are applied to the reclaimed silicon wafer. An entirety of the first metal layer 340 is made of a material selected from the group consisting aluminum, nickel and gold. An entirety of the second metal layer 370 is made of a material selected from the group consisting of titanium, nickel and silver.

Figure 4:
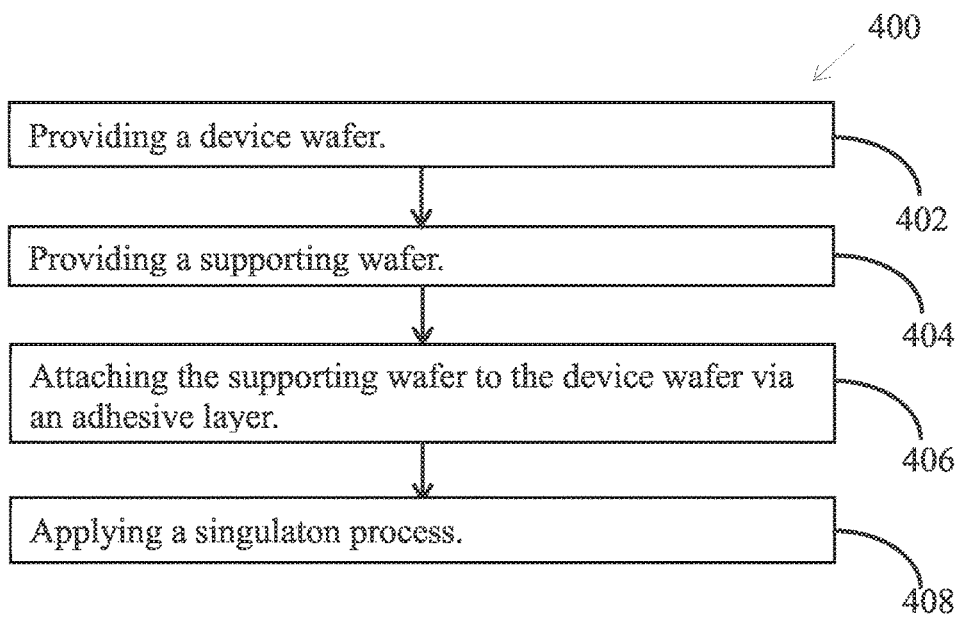
FIG. 4 is a flowchart of a process to develop a plurality of semiconductor packages in examples of the present disclosure.

FIG. 4 is a flowchart of a process 400 to develop a plurality of semiconductor packages in examples of the present disclosure. FIGS. 5A-5D show the cross sections of the corresponding steps. The process 400 may start from block 402.

Figure 5A:
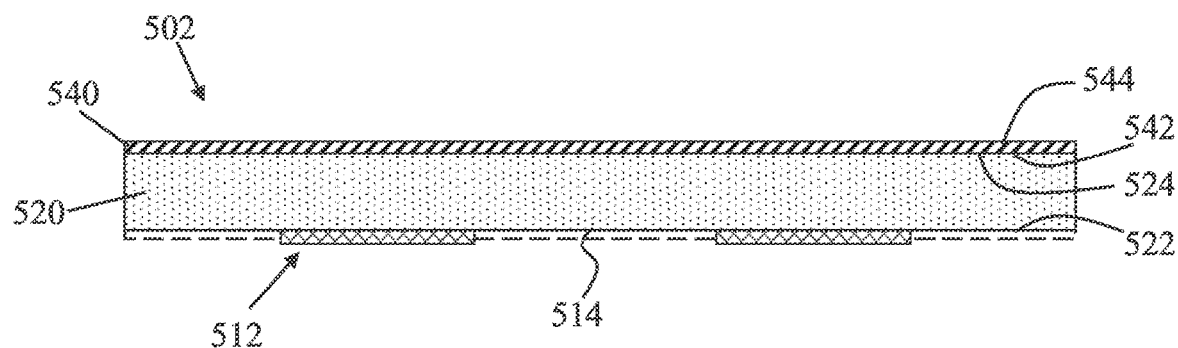
FIGS. 5A-5D show the cross sections of the corresponding steps of the process of FIG. 4 in examples of the present disclosure.

In block 402, referring now to FIG. 5A, a device wafer 502 is provided. The device wafer 502 may be a 4-inch, 6-inch, 8-inch, 12-inch, or 18-inch diameter wafer. The device wafer 502 comprises a semiconductor substrate 520, a first metal layer 540, and a plurality of contact pads 512. The device wafer 502 may further comprises a passivation layer 514 (shown in dashed lines). Similar to FIG. 3A of US Patent Application Publication No. 2019/0189569, each of the plurality of contact pads 512 may comprise an aluminum layer and a nickel-gold layer. In one example, the first metal layer 540 is directly deposited onto the semiconductor substrate 520.

The semiconductor substrate 520 has a front surface 522 and a back surface 524 opposite the front surface 522 of the semiconductor substrate 520. The first metal layer 540 has a front surface 542 and a back surface 544 opposite the front surface 542 of the first metal layer 540. The front surface 542 of the first metal layer 540 is directly attached to the back surface 524 of the semiconductor substrate 520. The plurality of contact pads 512 are attached to the front surface 522 of the semiconductor substrate 520.

In examples of the present disclosure, a thickness of the semiconductor substrate 520 is equal to or less than 50 microns. The thickness of the semiconductor substrate 520 is in a range from 25 microns to 35 microns. Block 402 may be followed by block 404.

Figure 5B:
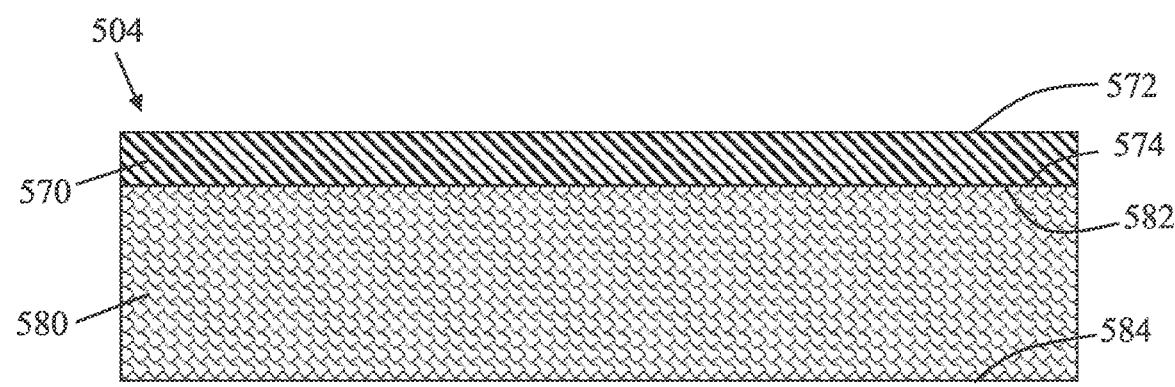

In block 404, referring now to FIG. 5B, a supporting wafer 504 is provided. The supporting wafer 504 comprises a second metal layer 570 and a rigid supporting layer 580. The second metal layer 570 has a front surface 572 and a back surface 574 opposite the front surface 572 of the second metal layer 570. The rigid supporting layer 580 has a front surface 582 and a back surface 584 opposite the front surface 582 of the rigid supporting layer 580. The front surface 582 of the rigid supporting layer 580 is directly attached to the back surface 574 of the second metal layer 570.

In examples of the present disclosure, a thickness of the rigid supporting layer 580 is larger than the thickness of the semiconductor substrate 520. The rigid supporting layer 580 is stiffer than a tape material. A thickness of the second metal layer 570 is larger than a thickness of the first metal layer 540. The rigid supporting layer 580 is non-conductive. An entirety of the rigid supporting layer 580 is made of a single crystal silicon material or a poly-crystal silicon material fabricated from a reclaimed silicon wafer. An entirety of the first metal layer 540 is made of a material selected from the group consisting of nickel, copper, titanium and steel. An entirety of the second metal layer 570 is made of a material selected from the group consisting of nickel, copper, titanium and steel. Block 404 may be followed by block 406.

Figure 5C:
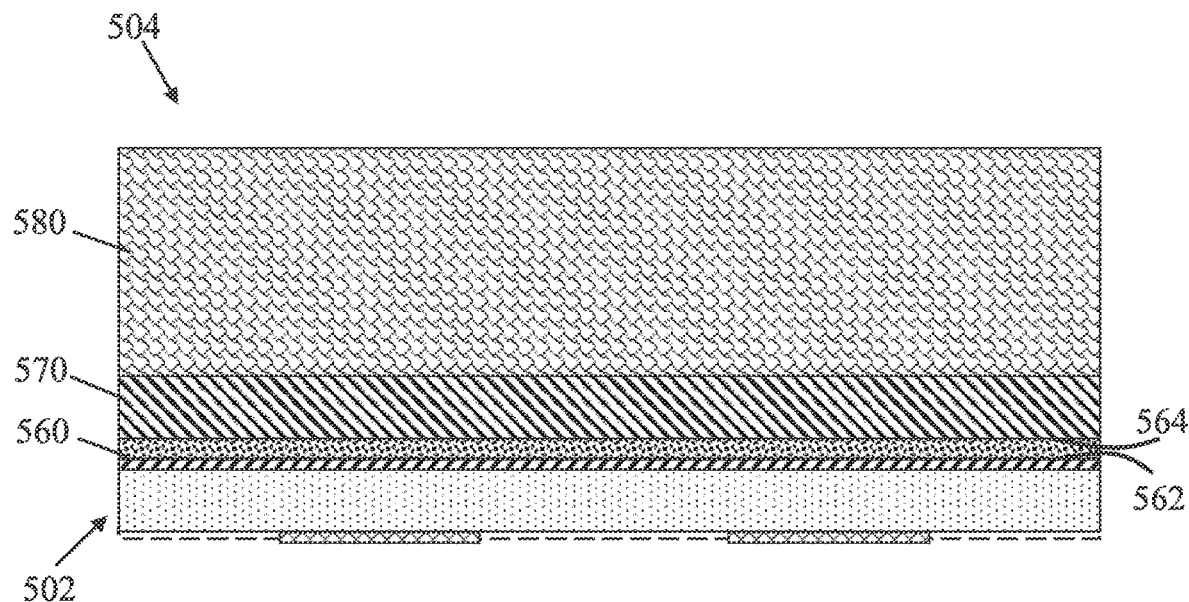

In block 406, referring now to FIG. 5C, the supporting wafer 504 is attached to the device wafer 502 via an adhesive layer 560. The adhesive layer 560 has a front surface 562 and a back surface 564 opposite the front surface 562 of the adhesive layer 560. The front surface 562 of the adhesive layer 560 is directly attached to the back surface 544 of the first metal layer 540. The front surface 572 of the second metal layer 570 is directly attached to the back surface 564 of the adhesive layer 560.

In examples of the present disclosure, the adhesive layer 560 comprises conductive adhesive. Block 406 may be followed by block 408.

Figure 5D:
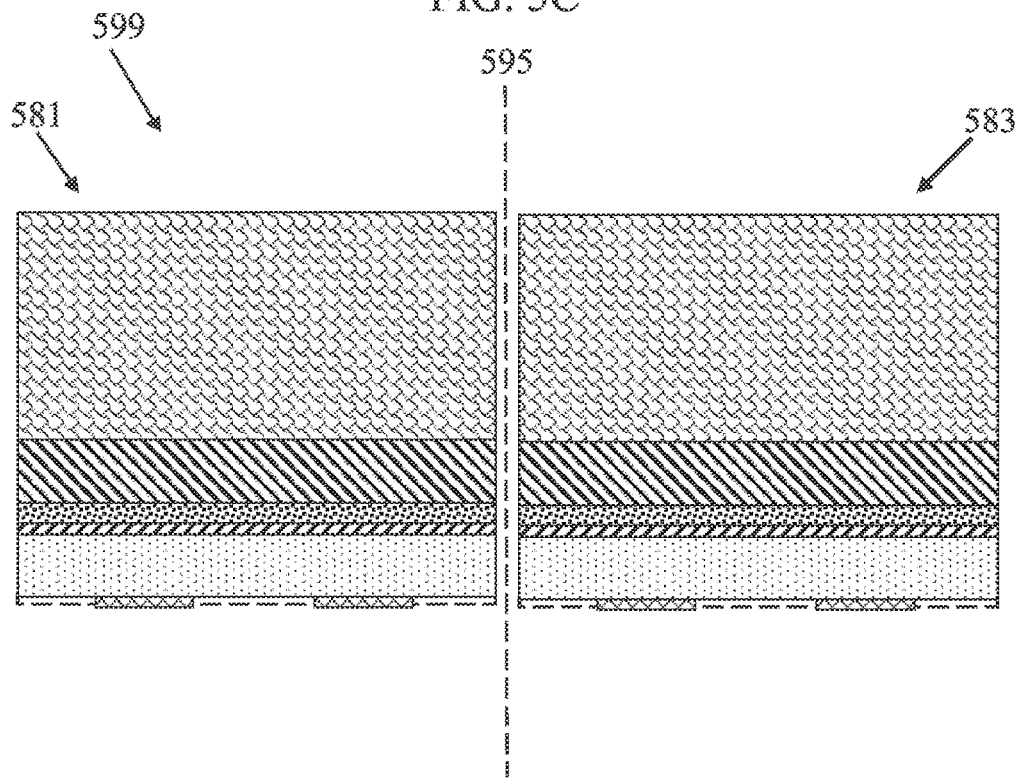

In block 408, referring now to FIG. 5D, a singulation process is provided so that a plurality of semiconductor packages 599 are formed. In one example, the singulation process is a laser cutting process. In another example, the singulation process is a saw cutting process. A first package 581 and a second package 583 are separated from a cutting process. Though only two packages are shown in FIG. 5D for simplicity, a total number of packages fabricated from a wafer may vary. In examples of the present disclosure, each of the plurality of semiconductor packages 599 is a common-drain metal-oxide-semiconductor field-effect transistor (MOSFET) chip scale package (CSP) for battery protection application.

Those of ordinary skill in the art may recognize that modifications of the embodiments disclosed herein are possible. For example, a total number of the plurality of contact pads 302 may vary. Other modifications may occur to those of ordinary skill in this art, and all such modifications are deemed to fall within the purview of the present invention, as defined by the claims.

The invention claimed is:

1. A semiconductor package comprising:
a semiconductor substrate having a front surface and a back surface opposite the front surface of the semiconductor substrate;
a first metal layer having a front surface and a back surface opposite the front surface of the first metal layer, the front surface of the first metal layer being directly attached to the back surface of the semiconductor substrate;
an adhesive layer having a front surface and a back surface opposite the front surface of the adhesive layer, the front surface of the adhesive layer being directly attached to the back surface of the first metal layer;
a second metal layer having a front surface and a back surface opposite the front surface of the second metal layer, the front surface of the second metal layer being directly attached to the back surface of the adhesive layer;
a rigid supporting layer having a front surface and a back surface opposite the front surface of the rigid supporting layer, the front surface of the rigid supporting layer being directly attached to the back surface of the second metal layer; and
a plurality of contact pads attached to the front surface of the semiconductor substrate;
wherein a thickness of the semiconductor substrate is equal to or less than 75 microns;
wherein a thickness of the rigid supporting layer is larger than the thickness of the semiconductor substrate;
wherein the rigid supporting layer is stiffer than a polymer material;
wherein the semiconductor package is a common-drain metal-oxide-semiconductor field-effect transistor (MOSFET) chip scale package (CSP);
wherein two gates and two sources are on a front surface of the common-drain MOSFET CSP; and
wherein a common-drain is on a back surface of the common-drain MOSFET CSP.

2. The semiconductor package of claim 1, wherein a thickness of the first metal layer is in a range from 1 micron to 5 microns.

3. The semiconductor package of claim 1, wherein a thickness of the second metal layer is in a range from 30 microns to 100 microns.

4. The semiconductor package of claim 1, wherein a thickness of the rigid supporting layer is in a range from 75 microns to 500 microns.

5. The semiconductor package of claim 1, wherein the adhesive layer comprises electrically conductive adhesive.

6. The semiconductor package of claim 1, wherein a Young's modulus of an entirety of the rigid supporting layer is in a range from 50% to 150% of a Young's modulus of the semiconductor substrate; and wherein a coefficient of thermal expansion (CTE) of the entirety of the rigid supporting layer is in a range from 50% to 250% of the CTE of the semiconductor substrate.

7. The semiconductor package of claim 1, wherein an entirety of the rigid supporting layer is made of a single crystal silicon material or a poly-crystal silicon material fabricated from a reclaimed silicon wafer.

8. The semiconductor package of claim 1, wherein an entirety of the rigid supporting layer is made of an amorphous glass material.

9. The semiconductor package of claim 1, wherein an entirety of the first metal layer is made of a material selected from the group consisting of aluminum, nickel, and gold; and wherein an entirety of the second metal layer is made of a material selected from the group consisting of titanium, nickel, and silver.

10. A method for fabricating a plurality of semiconductor packages, the method comprising the steps of:

providing a device wafer comprising
  a semiconductor substrate having a front surface and a back surface opposite the front surface of the semiconductor substrate;
  a first metal layer having a front surface and a back surface opposite the front surface of the first metal layer, the front surface of the first metal layer being directly attached to the back surface of the semiconductor substrate; and
  a plurality of contact pads attached to the front surface of the semiconductor substrate;
providing a supporting wafer comprising
  a second metal layer having a front surface and a back surface opposite the front surface of the second metal layer; and
  a rigid supporting layer having a front surface and a back surface opposite the front surface of the rigid supporting layer, the front surface of the rigid supporting layer being directly attached to the back surface of the second metal layer;
attaching the supporting wafer to the device wafer via an adhesive layer, the adhesive layer having a front surface and a back surface opposite the front surface of the adhesive layer, the front surface of the adhesive layer being directly attached to the back surface of the first metal layer, and the front surface of the second metal layer being directly attached to the back surface of the adhesive layer; and
applying a singulation process;
wherein a thickness of the semiconductor substrate is equal to or less than 75 microns;
wherein a thickness of the rigid supporting layer is larger than the thickness of the semiconductor substrate;
wherein the rigid supporting layer is stiffer than a polymer material;
wherein each of the plurality of semiconductor packages is a common-drain metal-oxide-semiconductor field-effect transistor (MOSFET) chip scale package (CSP);
  wherein two gates and two sources are on a front surface of the common-drain MOSFET CSP; and
  wherein a common-drain is on a back surface of the common-drain MOSFET CSP.

11. The method of claim 10, wherein a thickness of the first metal layer is in a range from 1 micron to 5 microns.

12. The method of claim 10, wherein a thickness of the second metal layer is in a range from 30 microns to 100 microns.

13. The method of claim 10, wherein a thickness of the rigid supporting layer is in a range of 75 microns to 500 microns.

14. The method of claim 10, wherein the adhesive layer comprises electrically conductive adhesive.

15. The method of claim 10, wherein a Young's modulus of an entirety of the rigid supporting layer is in a range from 50% to 150% of a Young's modulus of the semiconductor substrate; and wherein a coefficient of thermal expansion (CTE) of the entirety of the rigid supporting layer is in a range from 50% to 250% of the CTE of the semiconductor substrate.

16. The method of claim 10, wherein an entirety of the rigid supporting layer is made of a single crystal silicon material or a poly-crystal silicon material fabricated from a reclaimed silicon wafer.

17. The method of claim 10, wherein an entirety of the rigid supporting layer is made of an amorphous glass material.

18. The method of claim 10, wherein an entirety of the first metal layer is made of a material selected from the group consisting of aluminum, nickel, and gold; and wherein an entirety of the second metal layer is made of a material selected from the group consisting of titanium, nickel, and silver.

* * * * *